United States Patent [19]

Carnes et al.

[11] 4,027,260
[45] May 31, 1977

[54] CHARGE TRANSFER CIRCUITS EXHIBITING LOW PASS FILTER CHARACTERISTICS

[75] Inventors: James Edward Carnes, North Brunswick; Robert Herman Dawson, Princeton; Robert Thomas Fedorka; Henry William Kaiser, both of Cherry Hill, all of N.J.

[73] Assignee: RCA Corporation, New York, N.Y.

[22] Filed: Jan. 14, 1976

[21] Appl. No.: 648,929

[52] U.S. Cl. .......................... 333/70 R; 307/221 D; 333/70 A; 357/24

[51] Int. Cl.² ................. G11C 11/34; G11C 27/02; H01L 29/78; H03H 7/10

[58] Field of Search ....... 307/221 C, 221 D, 221 R, 307/295, 304; 333/70 T, 70 R, 70 A; 357/24; 328/167

[56] References Cited

UNITED STATES PATENTS 3,881,117  4/1975  Tompsett ..................... 307/221 D
3,919,468  11/1975  Weimer ..................... 307/221 D X
3,986,198  10/1976  Kosonocky ..................... 357/24

OTHER PUBLICATIONS

Sequin et al.—"Charge Transfer Devices", Academic Press, Inc., New York 1975; title page and pp. 48–53.
"Reference Data for Radio Engineers", Fifth Edition, Howard Sams, New York, 1968; title page & pp. 21-14.

Primary Examiner—Alfred E. Smith
Assistant Examiner—Marvin Nussbaum
Attorney, Agent, or Firm—H. Christoffersen; Samuel Cohen

[57] ABSTRACT

The input signal to a CCD register is sampled many times during one period of the multiple phase voltages employed to drive the CCD. The samples are translated to small charge packets which are added to one another during the one period to produce a sum charge packet which subsequently is propagated down the register. The higher frequency components, including noise, which are present in the input signal largely cancel during the charge addition process.

8 Claims, 8 Drawing Figures

CHARGE TRANSFER CIRCUITS EXHIBITING LOW PASS FILTER CHARACTERISTICS

The government has rights in this invention pursuant to contract No. DAABO7-75C-1323 awarded by the Department of the Army.

The present invention relates to charge transfer circuits such as charge-coupled devices (CCD's) and particularly to such circuits which exhibit low pass filter chracteristics.

The invention is illustrated in the drawing of which:

Figure 1:
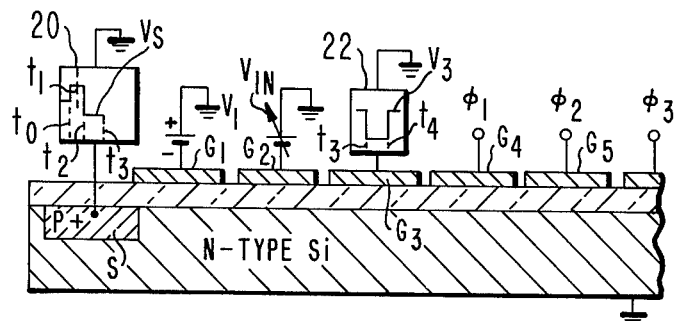
FIG. 1 is a section through a known CCD register.

FIG. 1 illustrates an embodiment of a CCD register described in detail in copending U.S. application Ser. No. 565,563, filed Apr. 7, 1975 by Walter F. Kosonocky now issued as U.S. Pat. No. 3,986,198 and assigned to the same assignee as the present application. The copending application is a continuation of U.S. application Ser. No. 369,580, filed June 13, 1973 and now abandoned.

Figure 2:
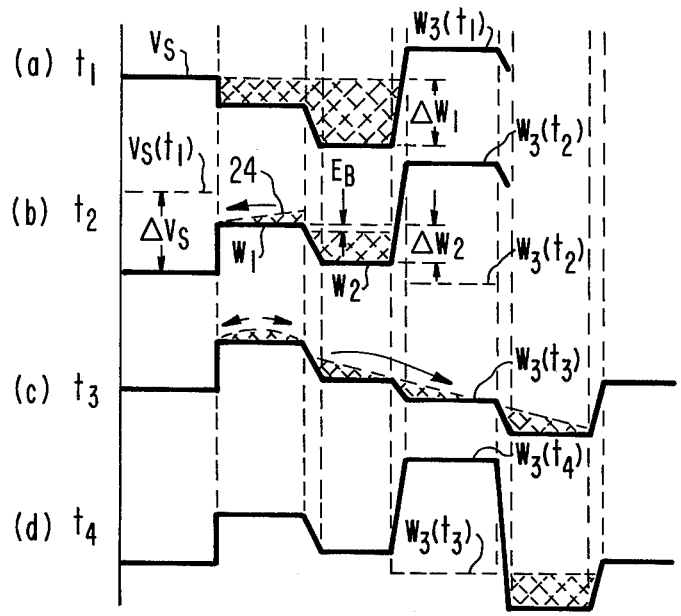
FIG. 2 is a drawing of the surface potential profiles present during the operation of the CCD of FIG. 1.

The operation of the CCD register of FIG. 1 is illustrated in FIG. 2. Initially, the input region S is maintained at a relatively positive potential so that it acts as a source of charge carriers (holes in the case of the N-type silicon substrate illustrated). The first electrode $G_1$ is maintained at a fixed potential such that a conduction channel is present in the substrate beneath this electrode. The second electrode $G_2$ receives a signal potential $V_{in}$. The third electrode $G_3$ initially is at a relatively positive potential such that a potential barrier is present beneath this electrode. In response to these voltages, the potential well beneath the electrode $G_2$ fills to a certain level defined by the difference $\Delta W_1$ between two surface potentials, as shown in FIG. 1(a).

After the initial filling of the well beneath the electrode $G_2$, the potential of the source region S is changed to a relatively more negative value as shown in FIG. 2(b) and this region S therefore operates as a drain for holes. Now charge flows from the potential well beneath electrode $G_2$ back to the source region as indicated by the arrow in FIG. 2(b). As explained in the copending application, the charge remaining in the potential well beneath electrode $G_2$ is relatively noise free. The amount of this charge is proportional to the signal amplitude $V_{in}$, that is, it is proportional to the difference $\Delta W_2$ between the fixed surface potential $W_1$ beneath electrode $G_1$ and the surface potential $W_2$ beneath electrode $G_2$. This charge packet subsequently is propagated down the CCD register by first making electrode $G_3$ relatively negative while electrode $G_4$ is more negative as shown in FIG. 2(c), then making electrode $G_3$ relatively positive as shown in FIG. 2(d), and then applying the remaining multiple phase voltages, in normal fashion.

Because the CCD is a sampled data device, some type of filter (not shown) normally is provided at the input of the CCD register of FIG. 1 to exclude signal components with frequencies equal to or greater than one-half the sampling frequency $f_s$. If this is not done, and there are high frequency components in the input signal, these higher frequency signals will be present along with the base band ($<f_s/2$) signals and will cause signal distortion.

Figure 3:
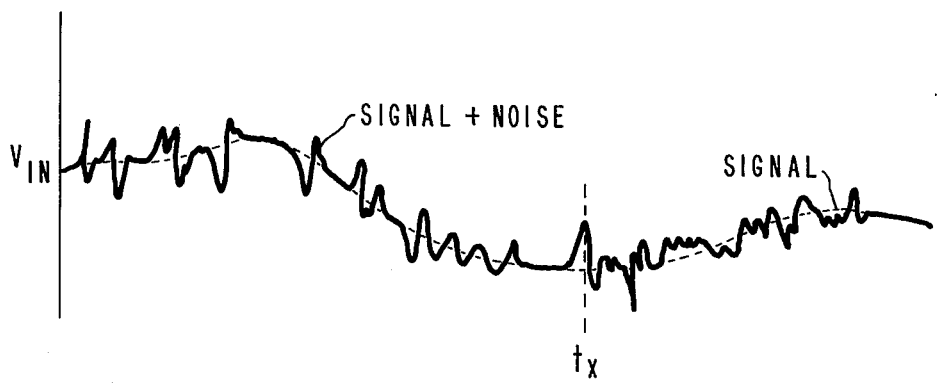
FIG. 3 is a drawing of a noisy input signal for a CCD.

The apparatus of FIG. 1 operates in a perfectly satisfactory fashion for input signals in an appropriate frequency range (lower than $f_s/2$) in that there is very little noise or distortion (see above) introduced by the CCD circuit. That is, assuming that this input signal is relatively noise free, the successive charge packets produced during the successive periods of $\phi_1$ are also relatively noise free. However, if the input signal is of the type illustrated in FIG. 3, that is, if it is noisy, then the charge packets produced will be equally noisy. For example, if time $t_2$ of FIG. 2(b) corresponds to time $t_x$ of FIG. 3, then the charge packet which will become stored in the potential well beneath electrode $G_2$ will be mostly noise. This, of course, is highly undesirable.

Figure 4:
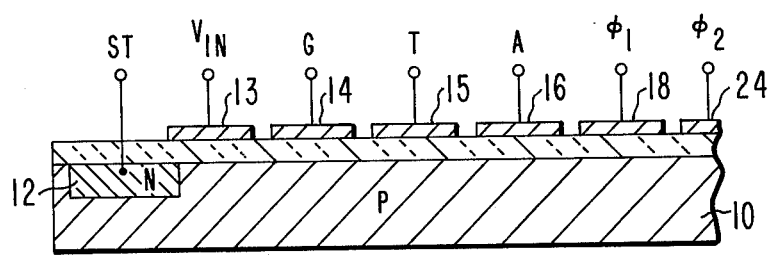
FIG. 4 is a section through a CCD according to an embodiment of the invention.

FIG. 4 illustrates an embodiment of the present invention. This structure provides low pass filtering internal of the CCD so that for many types of input signal, a separate low pass filter ahead of the CCD is not needed. (A detailed discussion of this feature of the circuit is given later.) For purposes of illustration, the substrate 10 is shown to be of P type and the source region 12 of N type. In the known structure of FIG. 1, there are three electrodes between the source region S and the $\phi_1$ electrode. In the CCD of FIG. 4, there are four electrodes, 13, 14, 15 and 16. For purposes of illustration, the input signal $V_{in}$ is shown as being applied to the first electrode 13 and the second electrode 14 is maintained at a fixed bias potential G. However, the circuit would be equally operative if the reverse were the case, provided the proper bias level were chosen. In other words, the circuit would be equally operative with the voltages similar to those employed in FIG. 1 for electrodes $G_1$ and $G_2$.

Figure 5:
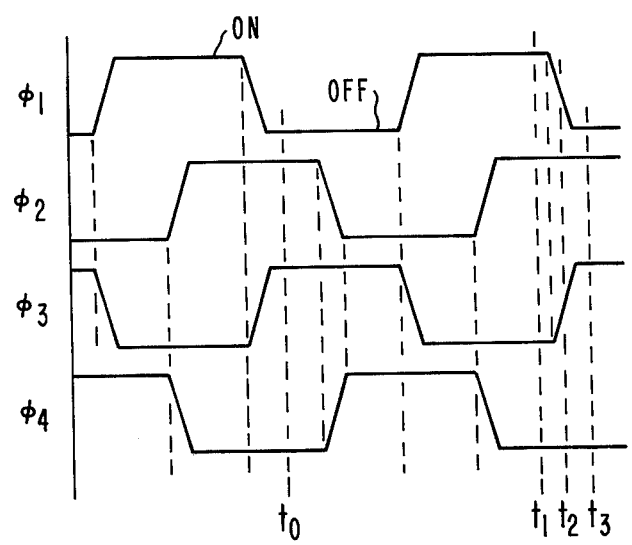
FIG. 5 is a drawing of the multiple phase voltages employed to operate the CCD of FIG. 4.
Figure 6:
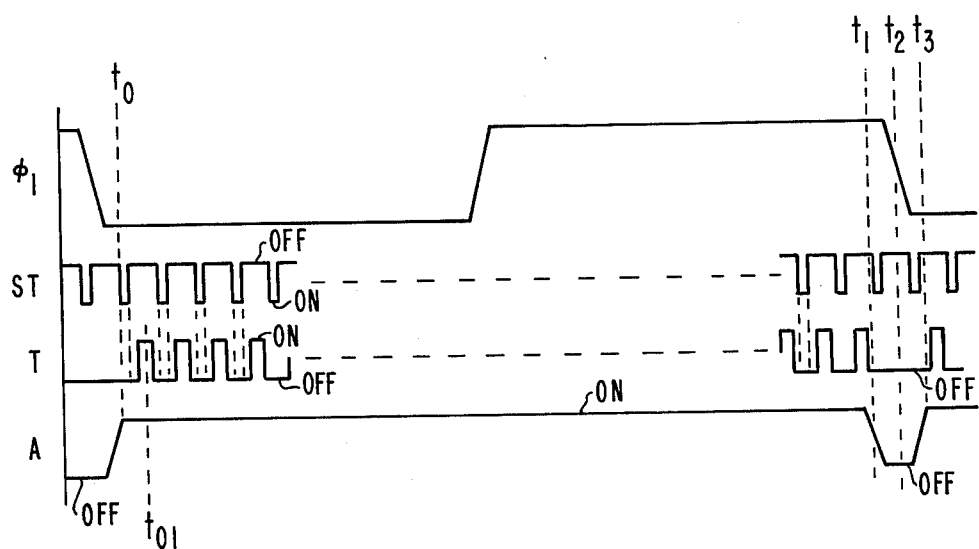
FIG. 6 is a drawing of other waveforms employed in the operation of the device of FIG. 4.
Figure 7:
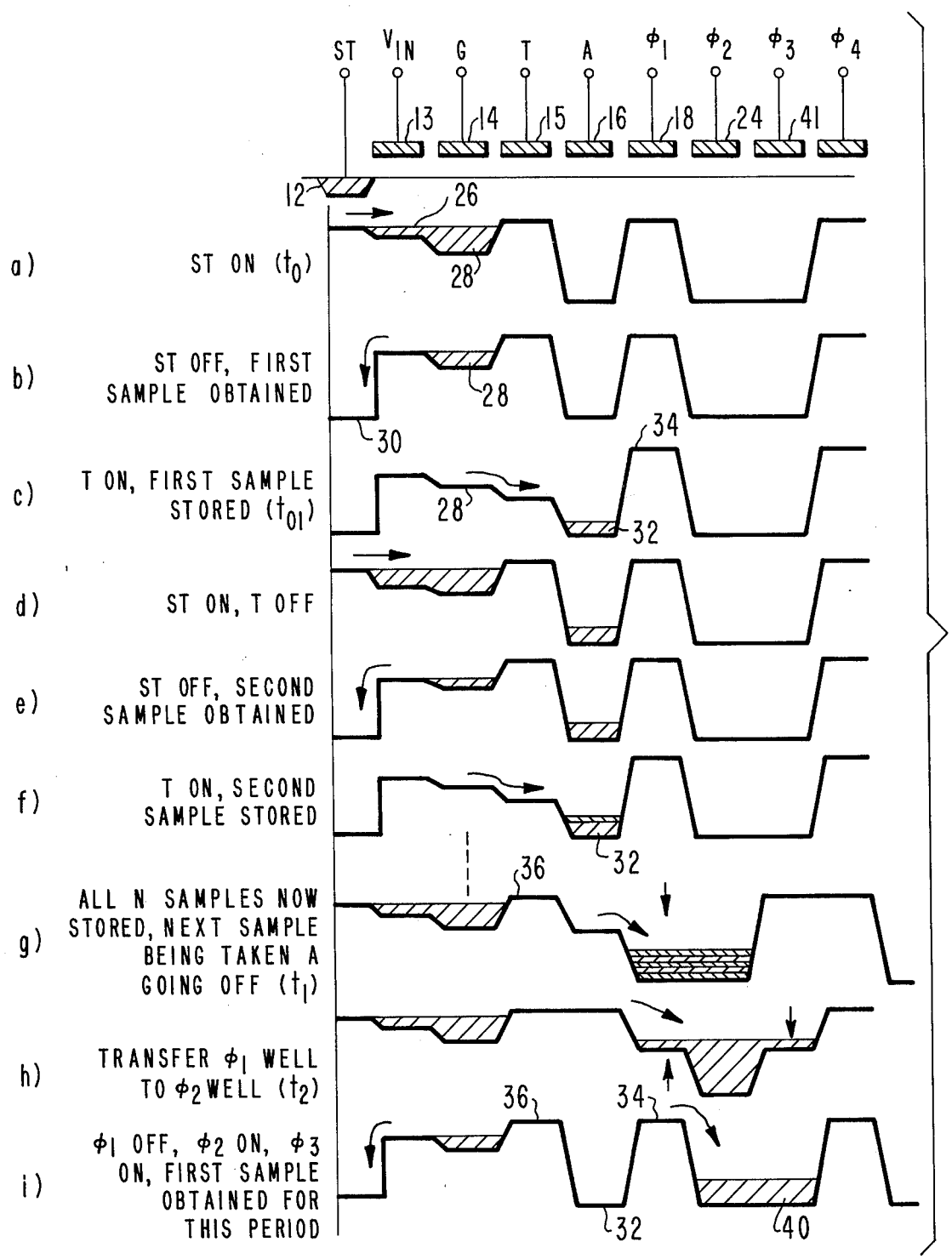
FIG. 7 is a drawing of surface potential profiles during successive operating intervals of the CCD of FIG. 4.

The operation of the circuit in FIG. 4 is illustrated in FIGS. 5–7. In brief, in the circuit of FIG. 4 rather than taking only a single sample during one period of $\phi_1$, the input signal is sampled a number N of times, the value of N depending upon the nature of the input signal the frequency of the multiple phase voltages and so on. In an example given later, N = 10 but even with N considerably lower than 10 some improvement still may be obtained. The higher N for a fixed period during which N samples are taken, the greater will be the fidelity of the signal reproduced by the CCD. Each sample of the input signal is converted to a small charge packet and that small charge packet is temporarily stored beneath electrode 16 or 16 and 18, or 16, 18 and 24, depending upon the time during the period of $\phi_1$, when the sample is taken. The successive charge packets are additively combined as they are being stored. As the noise of the input signal is random in nature, the addition of the successive small samples results in substantial cancellation of the noise component.

For purposes of the present explanation, four phase operation is assumed (however, the circuit is equally operative with any number of phases). The four phase waveforms are illustrated in FIG. 5 and $\phi_1$ is shown in expanded scale in FIG. 6.

FIGS. 5–7 should be referred to. At time $t_0$, a negative strobe signal ST is applied to the region 12. This region therefore acts as a source of charge carriers. The signal $V_{in}$ applied to electrode 13 causes a conduction channel to form at 26 in FIG. 7(a) and electrons flow from the source 12 through this conduction channel and into potential well 28 beneath electrode 14.

Upon the termination of the strobe pulse, region 12 goes relatively positive and operates as a drain. Now excess charge flows from potential well 28 back to the drain region illustrated schematically at 30 in FIG. 7(b). The amount of charge remaining in potential well 28 is a linear function of the amplitude of the input signal $V_{in}$.

A short time later (time $t_{01}$ in FIG. 6) the transfer signal T goes high and charge transfers from potential well 28 to the potential well 32 beneath electrode 16. This is illustrated in FIG. 7(c). Note that at this time, A, the voltage applied to electrode 16, is relatively positive so that there is a potential well present. At this same time $\phi_1$ is relatively negative so that a barrier 34 is present beneath electrode 18.

The process above is continued for a number of times equal to the number N of samples it is desired to take. The production of a second charge sample is shown in FIGS. 7(d and e). FIG. 7(f) illustrates the transfer of this second sample to the potential well 32 beneath electrode 16. There, the second sample combines with the first. Each sample includes some charge due to the information component of the signal and some charge (or deficit of charge) due to the noise component. However, upon the completion of the sampling process the noise components, which are random in nature, tend to cancel one another.

FIG. 7(g) illustrates the situation after N samples have been taken, where N is the total number of samples made during one period of $\phi_1$. Referring to FIGS. 5 and 6, the time is $t_1$. At this time $\phi_1$ already is high so that a potential well is present beneath electrode 18. $\phi_2$ also is high so that a potential well is present beneath electrode 24. T is low so that there is a potential barrier 36 beneath electrode 15. A is going low to effect the transfer of the accumulated N charge packets to the potential well beneath electrodes 18 and 24.

At time $t_2$, the combined charge packet starts to transfer down the CCD register, as illustrated at $(h)$ in FIG. 7. At time $t_2$, $\phi_2$ is high, $\phi_1$ is going low and $\phi_3$ is going high. During this time, T is still low and A is low. A short time later, as illustrated in FIG. 7(i), a new charge sample has been obtained. The time is $t_3$ (FIG. 6). T is still low so that a potential barrier is still present at 36. A has just gone high so that a potential well is present at 32. $\phi_1$ is low so that a potential barrier is present at 34. The previous combined charge packet is now present in the combined potential well 40 beneath the $\phi_2$ and $\phi_3$ electrodes 24 and 41.

The technique just described is particularly useful for relatively low bandwidth signals, low bandwidth because the sampling rate, as a practical matter, cannot readily exceed about 10 to 20 MHz in the present state of the art. At the lower of these sampling rates, to obtain say 10 samples ($N = 10$) per period of $\phi_1$, this implies a frequency of 1 MHz for $\phi_1$, and this is reasonable. Of course, during one period of $\phi_1$, that is, during the entire period during which the N samples are being made, the information signal component of the input signal should not vary a great deal. This implies a relatively low bandwidth for the signal, one, in the limit, not greater than the Nyquist Limit (500 KHz for the case of a $10^{-6}$ seconds period (1 MHz frequency) during which the N samples are being taken) and preferably lower. That is, the lower the bandwidth of the signal sampled relative to the frequency of $\phi_1$ (which defines the period during which N samples are taken), and the larger N, the more faithful a reproduction will the signal at the output circuit (not shown) of the CCD register be of the information component of the input signal.

While the present invention has been illustrated in terms of a low-noise input CCD, this is not essential to the invention. The low noise input CCD insures that the CCD itself does not introduce a noise component and is therefore a preferred circuit. However, the present invention will work, that is, the random noise component present in the input signal will be substantially lessened, even if the small sample packets of charge which are combined to form a single charge packet, are obtained in other ways. Thus, a CCD with a standard input circuit and means providing a temporary storage well for accumulating the charge samples may be employed.

It is also to be understood that while the embodiment of the invention illustrated is a surface channel CCD, a buried channel device may be used instead. Also, the inventive teachings are applicable, in principle, to other forms of charge transfer circuits such as bucket brigade circuits. Also, while particular substrate and diffusion dopings and electrode structures are shown in the drawing, it is to be understood that they are examples only, many other alternatives being possible.

In the discussion above it is explained at length how the noise components (high frequency, randomly occurring signal components) of an input signal cancel when the charge transfer structure of FIG. 4 is operated in the manner described. The high frequency regularly recurrent components of the input signal also largely are eliminated and it is for this reason that the input structure is stated to exhibit the characteristics of a low pass filter. The transfer function of this low pass filter can be determined using z-transform analysis. In the time domain, the charge which eventually represents the CCD signal is the sum of the multiple samples of the input signal; that is:

$$Q_{out}(t) = \sum_{k=0}^{N-1} Q_{in}(t - k\tau_s) \qquad (1)$$

wherein $Q_{in}(t)$ is the charge introduced at each sampling event, $\tau_s$ is the sampling interval and N is the number of samples per CCD clock period (multiple phase voltage period). Since $N\tau_s = \tau_c$, where $\tau_c$ = clock period = $1/f_c$, Equation (1) can be re-written as:

$$Q_{out}(t) = \sum_{k=0}^{N-1} Q_{in}\left(t - \frac{k}{Nf_c}\right) \qquad (2)$$

Shifting to the z-domain:

$$Q_{out}(z) = \sum_{k=0}^{N-1} Q_{in}(z) Z^{-k} \qquad (3)$$

-continued where $z = \exp\left(\frac{i2\pi f}{Nf_c}\right)$

The transfer function is then given by:

$$H(z) = \sum_{k=0}^{N-1} z^{-k} \quad (4)$$

The amplitude response is given by:

$$|H(z)| = \left|\sum_{k=0}^{N-1} z^{-k}\right| = \left[\left[\sum_{k=0}^{N-1} \cos\frac{2\pi kf}{Nf_c}\right]^2 + \left[\sum_{k=0}^{N-1} \sin\frac{2\pi kf}{Nf_c}\right]^2\right]^{1/2} \quad (5)$$

Figure 8:
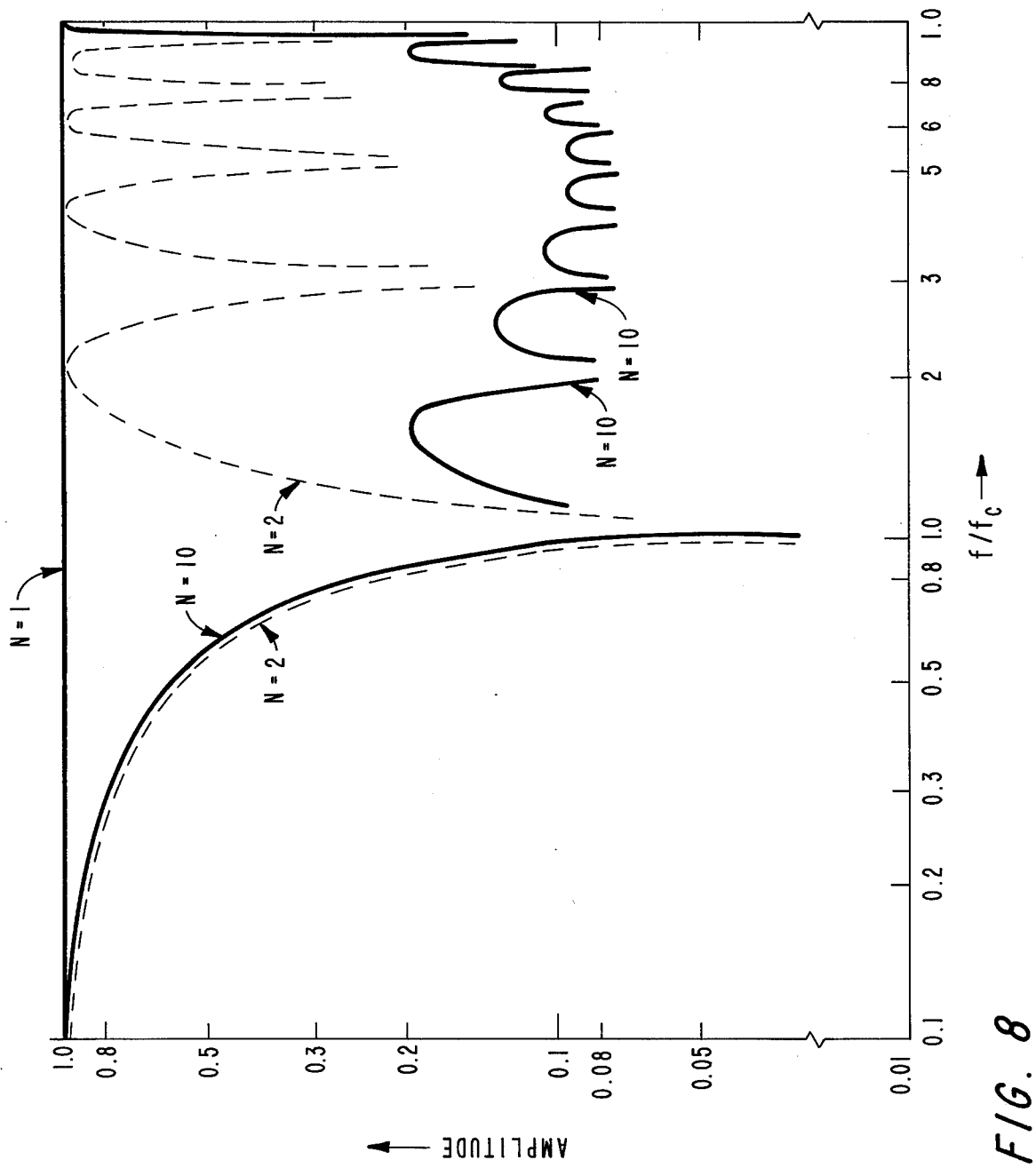
FIG. 8 is a graph which illustrates the low pass filter chracteristics exhibited during the operation of the system of FIG. 4.

This function is plotted in log-log scale in FIG. 8 for two values of N, the number of samples per CCD clock period, $N = 2$ (shown by dashed lines) and $N = 10$ (shown in solid line). In this graph $f$ is the frequency component of the input signal and $f_c$ is the frequency of the multiple phase voltages. Note, especially in the case of $N = 10$, the simulation of the pass characteristic for a low pass filter. The first part of the curve for $N = 10$ essentially superimposes over the first part of the curve for $N = 2$; however, they are shown closely adjacent one another so that the reader will be aware that both are present.

One feature to be observed is that for integer values of $f/Nf_c$, the amplitude response is unity. For example, in the case where $N = 2$, the response is unity at $f/f_c = 2.0, 4.0, 6.0$, etc. For $N = 10$, the response is unity for $f/f_c = 10.0, 20.0, 30.0$, etc. At all other integer values of $f/f_c$, regardless of N, the response goes to zero. The maximum of the side lobes occur at half integer values of $f/f_c$, with peak values which depend upon the ratio of $f/Nf_c$. For example, for the case $N = 10$, the peak side lobes range from 0.22 at $f/f_c = 1.5$ and 8.5 down to 0.10 at $f/f_c = 4.5$ and 5.5. Not shown in the figure is the case for $N = 30$ which has peak side lobe values ranging from 0.21 at $f/f_c = 1.5$ and 28.5 down to 0.03 at $f/f_c = 14.5$ and 15.5. Out to $f/f_c = 4.5$ there is little difference between $N = 10$ and $N = 30$; however, for $N = 30$ the side lobe magnitudes continue to decrease beyond $f/f_c = 4.5$ out to 14.5.

The optimum value for N therefore will depend upon the frequency response of other circuitry, for example, the input interface circuit, and the incoming frequency spectrum.

What is claimed is:

1. A method for translating an input signal to a charge which is to be propagated down a charge transfer register, the signal having an information component in a relatively lower frequency band and relatively higher frequency components, comprising the steps of:
   sampling the signal during N successive, discrete time intervals which are spaced from one another by intervening time intervals, where N is an integer equal to at least 2 and where the frequency corresponding to the total period during which the N samples are taken is greater by a factor of at least two than the bandwidth of the information component of the signal;
   in response to each signal sample, producing a charge packet of amplitude proportional to that of the signal sample;
   combining the N charge packets thereby obtained to form a single charge packet; and
   propagating the single charge packet down the register.

2. The method of claim 1 wherein the step of producing a charge packet comprises:
   providing a potential well in the charge storage medium of said charge transfer register;
   filling that potential well at least to a given level with charge; and
   partially emptying that potential well to a new level proportional to the signal sample amplitude.

3. The method of claim 1 wherein the step of combining the N charge packets comprises:
   providing a potential well in the charge storage medium of said charge transfer register; and
   as each charge packet is produced, transferring that charge packet to said potential well, until all N packets are present in that potential well.

4. The method of claim 1 wherein N is at least 10.

5. A method for substantially reducing the effects of noise in a signal it is desired to translate to charge which is to be propagated down a charge transfer register comprising the steps of:
   sampling the signal during N successive, discrete time intervals which are spaced from one another by intervening time intervals, where N is an integer equal to at least 5 and where the total period during which the N samples are taken is sufficiently short that the information signal level does not change substantially but, when noise is present, the noise signal level may vary in random fashion;
   in response to each signal sample, producing a charge packet of amplitude proportional to that of the signal sample;
   combining the N charge packets thereby obtained to form a single charge packet; and
   propagating that single charge packet down the register.

6. Apparatus for introducing an input signal which has an information component and which may also have higher frequency components into a charge transfer register, the register having a substrate, a source of charge carriers, storage electrode means, and transfer electrode means for transferring charge carriers from said source to the region of the substrate adjacent to said storage electrode means comprising, in combination:
   means for applying a potential to said storage electrode means for creating a first storage region in the substrate adjacent to said storage electrode means;
   means for obtaining N successive samples of said signal during N discrete sampling intervals, respectively, spaced from one another by intervening time intervals, the N sampling time intervals and the intervening time intervals together occupying a given time period, said means comprising means during each said sampling interval within said given period, responsive to the level of signal during that sampling interval, for transferring charge originating at said source, via said transfer electrode means, to said first storage region, where said given period corresponds to a frequency greater than the bandwidth of the information component of said signal by a factor equal to at least 2, and where N is an integer equal to at least 2;

a second storage region in the substrate for the storage of charge; and means, after said given period, for transferring the charge accumulated in said first storage region to said second storage region in the substrate.

7. Apparatus as set forth in claim 6 wherein said means for obtaining N successive samples comprises, for each sample, means for applying a control signal to said source for causing it to produce charge carriers and for then changing the level of said control signal for causing said source to operate as a drain for charge carriers, means in said transfer electrode means responsive to said input signal for creating a third storage region in said substrate for temporarily storing the charge signal from said source and for then permitting the charge signal to flow, in part, back to said source when it is operating as a drain, leaving in said third storage region a charge sample at a level proportional to the amplitude of said input signal, and means in said transfer electrode means responsive to a second control signal for emptying said charge sample into said first storage region.

8. Apparatus as set forth in claim 7 wherein said transfer electrode means comprises three electrodes, the one closest to said source maintained at a fixed potential, the second receptive of said input signal and the next between said second electrode and said storage electrode means and receptive of said second control signal.

* * * * *